United States Patent [19]

Frankel et al.

[11] Patent Number: 4,837,793
[45] Date of Patent: Jun. 6, 1989

[54] MASS LIMITED TARGET

[75] Inventors: Robert D. Frankel, Rochester; Jerry Drumheller, Webster, both of N.Y.

[73] Assignee: Hampshire Instruments, Inc., Rochester, N.Y.

[21] Appl. No.: 89,496

[22] Filed: Aug. 25, 1987

[51] Int. Cl.$^4$ ............................................. G21K 5/10
[52] U.S. Cl. ...................................... 378/34; 378/119; 378/143
[58] Field of Search ................. 378/34, 35, 119, 143, 378/144

[56] References Cited

U.S. PATENT DOCUMENTS

| | | | |
|---|---|---|---|
| 4,484,339 | 11/1984 | Mallozzi et al. | 378/34 |
| 4,504,964 | 3/1985 | Cartz et al. | 378/34 |
| 4,602,376 | 7/1986 | Doucet et al. | 378/119 |
| 4,692,934 | 9/1987 | Forsyth | 378/34 |
| 4,723,262 | 2/1988 | Noda et al. | 378/119 |

OTHER PUBLICATIONS

Nagel et al., *Laser Plasma Source for Pulsed X-Ray Lithography*, SPIE, vol. 135, Developments in Semiconductor Microlithography 111 (1978), pp. 45–52.

Primary Examiner—Carolyn E. Fields
Assistant Examiner—Joseph A. Hynds
Attorney, Agent, or Firm—Harry W. Barron

[57] ABSTRACT

Described herein is an improved target for use in a pulsed induced plasma X-ray lithography system. The target is formed as a disk shaped base having a series of concentric grooves formed on the side thereof incident to the focused laser beam. A plurality of small holes are fabricated through the base to the facing wall of the groove against which the laser beam is focused and a film, of a polyimide or silicon nitride material, covers the hole. A thin layer of metal target material is then placed on the film aligned with each hole. The thickness of the metal is selected to be sufficient to allow the complete ablation of the material during the existence of the X-ray emitting plasma. In this manner, a minimal amount of debris, either in the form of molten droplets or evaporated metal material, will be generated. The angle of the incident, or facing, side of the grooves is selected to be at an angle so that both the laser beam optical elements and the X-ray mask are positioned in an area where few, if any, molten droplets of debris are emitted. Such an angle may be 45° with respect to the plane in which the target substrate is moved while placing different target areas in incident with the laser beam. Such a target also allows the angle at which the laser beam is focused at the target to be approximately 65° from the alignment of the focal spot on the target and the vertical line to the mask. This angle, in turn, allows a slower lens and less optical coating to be used on the optical elements beyond the lens.

51 Claims, 5 Drawing Sheets

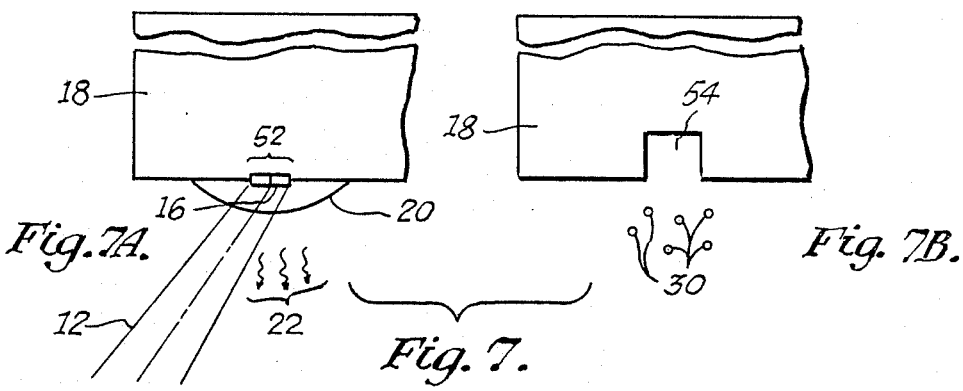
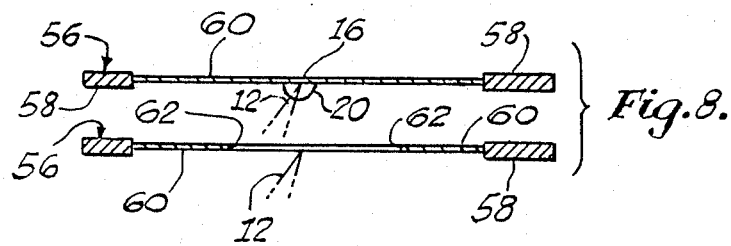
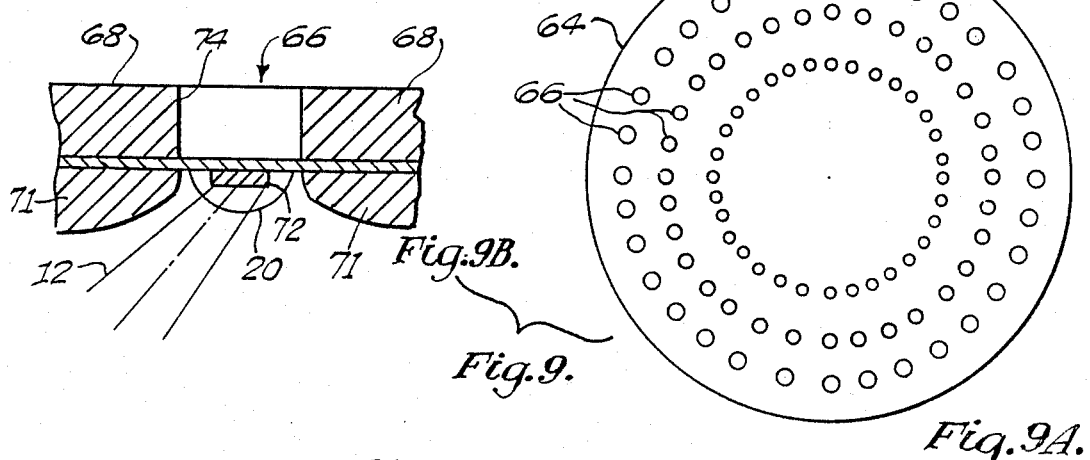
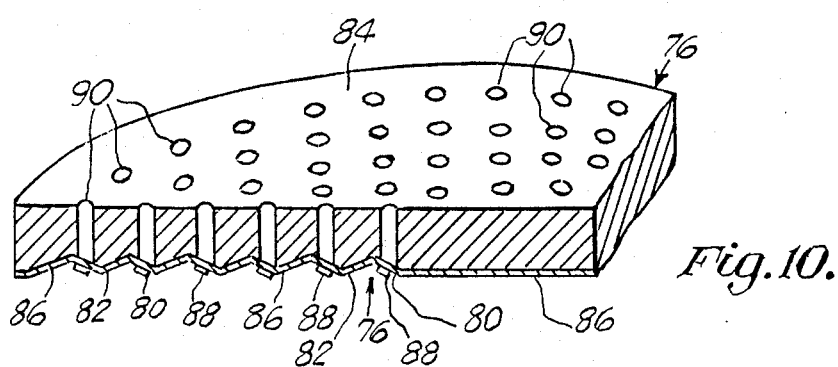

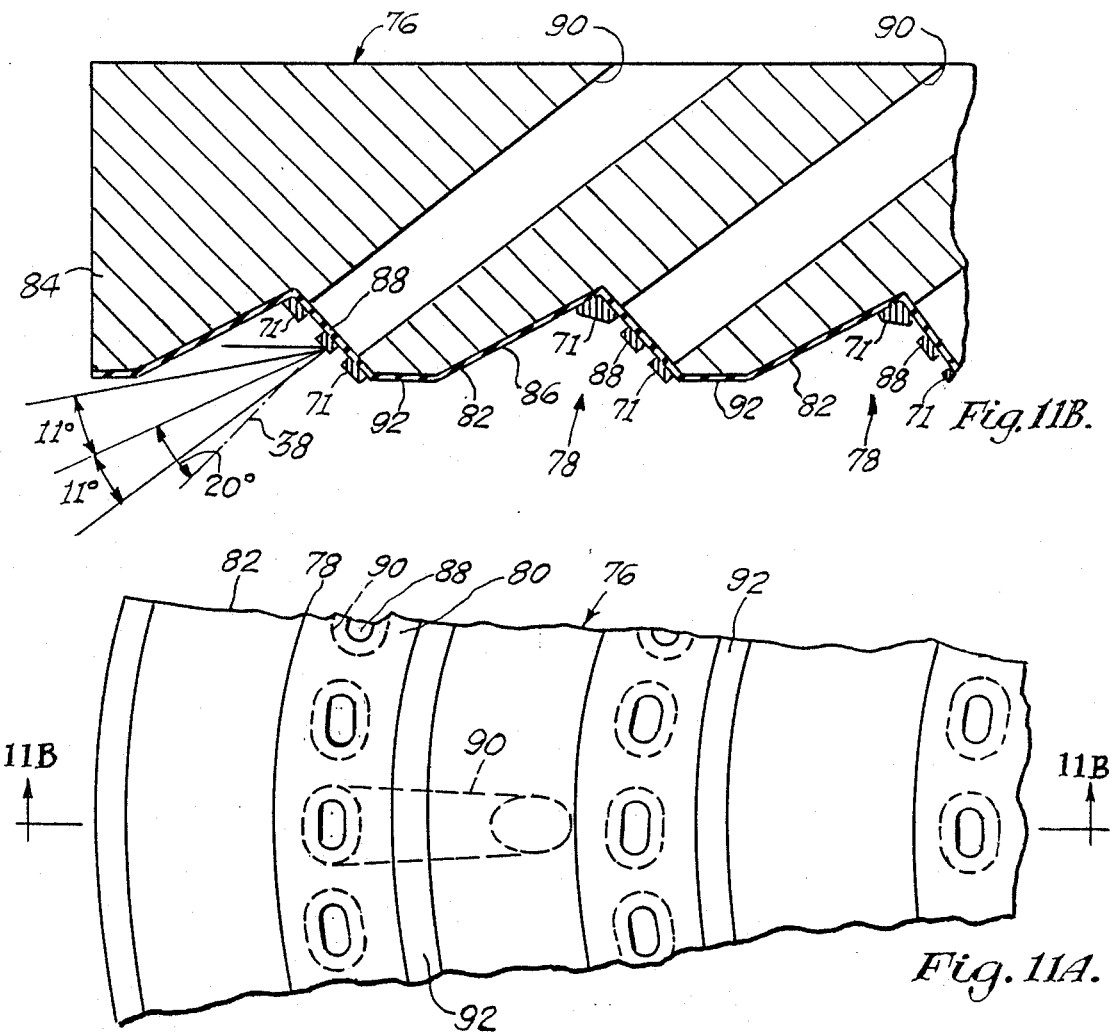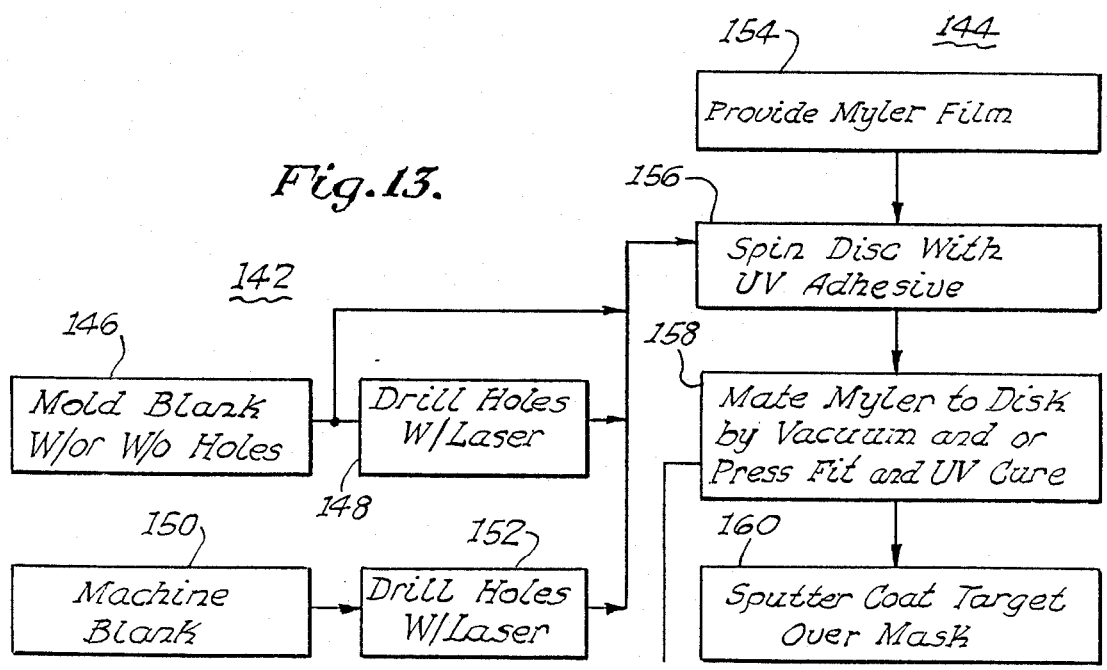

MASS LIMITED TARGET pg,8

This invention relates to a target used to generate x-rays by a pulsed laser beam, directed thereto with sufficient power to create an x-ray emitting plasma, and more particularly, to such a target, for use many times without replacement in an x-ray lithography machine, having a thickness generally equal to the target material ablated by the laser pulse and aligned in the system to minimize any debris resulting from the plasma generation.

In the past, semiconductor devices, commonly referred to as "chips", have been made using a process called lithography. In this process, a resist covered semiconductor wafer has a pattern of energy applied thereto to cause exposure of a corresponding pattern on the resist. The exposed resist may either be removed, or all but the exposed resist may be removed, and the patterned wafer is then further processed. By repeating the exposure and further processing many times, very sophisticated semiconductor devices can be fabricated.

Until very recently, ultraviolet light has been almost exclusively used in commercial applications as the energy to expose the resist material. However, as technology has advanced, the size of the features to be placed on the semiconductor wafer has become smaller and smaller and now the feature sizes have approached the limits of accurate patterning by ultraviolet light energy. One important limiting factor in using ultraviolet light is the wavelength of the light. The feature sizes being exposed are now approaching the wavelength of the ultraviolet used and further reducing the size of the features, while, at the same time, maintaining a reasonable depth of focus and simplicity of process, such as, single level resists, is no longer possible using ultraviolet light.

It has been suggested, at least as early as 1973 by Smith et al in U.S. Pat. No. 3,743,842, that x-rays would provide a better source of energy for lithographic exposures than light due to the significantly smaller wavelength of the x-rays. Many attempts have followed the teachings of Smith et al in suggesting various types of x-ray lithography machines for use in exposing resist covered semiconductor wafers. A significant advance in the art was made by Nagel et al, as described in U.S. Pat. No. 4,184,078, in which it was suggested that the x-rays could be created by focusing, in an evacuated chamber, a pulsed laser beam at a metal target with sufficient energy to cause a plasma to be created. Soft, or long wavelength, x-rays would be provided from the plasma and a mask and resist coated substrate, placed in the path of the x-rays so created, could then be exposed.

While the teaching of Nagel et al has many advantages over the prior teachings of Smith et al, has one significant drawback, in that the laser induced plasma, in addition to creating x rays, also created material and ion debris as a result of the over one hundred and fifty thousand °C. temperatures required to create the plasma. The material debris problem was recognized by Nagel et al, and a Mylar (polyethylene terephthlate) protective shield was provided to prevent the debris from damaging the sensitive x-ray mask membrane or from accumulating on the mask and acting as an absorber of the x-rays. However, the Mylar shield suggested by Nagel et al is not a desirable feature to incorporated into a commercial x-ray lithography machine because even a thin Mylar sheet will absorb a portion of the incident x-rays, particularly the more useful soft x-rays. Further, the membrane itself must be periodically replaced or renewed as it becomes increasingly opaque due to accumulated debris, or it suffers a catastrophic failure due to being struck by large chunks of debris.

A rotating shield was suggested by Grobman in U.S. Pat. No. 4,408,338 in which a rotating disk with alternating open and closed slots allowed the x-rays to pass through the open slots and the debris to be blocked by the closed slots. Other attempts at eliminating the debris, as suggested by Forsthy in U.S. patent application Ser. No. 06/669,442, filed Nov. 8, 1985 and entitled "X-Ray Lithography System", now U.S. Pat. No. 4,692,934, granted Sep. 8, 1987, which patent has been assigned to the assignee hereof, include using an aerodynamic sheet of gas to deflect the debris. Other techniques have also been tried in order to overcome the problem of the debris in the Nagel et al technique, such as using a thin foil target and blowing a hole through the target with the laser induced plasma, such as described in an article by Nagel et al entitled "Laser Plasma Source For Pulsed X-Rays", SPIE Vol. 136 *Developments in Semiconductor Microlithography III*, page 48, 52 (1978). As of now, commercial attempts at building x-ray lithography machines have utilized an x-ray tube, which does not emit debris, as the source for the x-rays, such as described in, for example, U.S. Pat. Nos. 4,514,858 and 4,516,253.

While the debris problem has been a particularly troblesome problem, there remain advantages to the techniques first suggested by Nagel et al. First, the size of the source can be made very small by simply focusing the laser beam into a small spot. Second, the duration of the burst of x-rays provided can be made very short by limiting the time that the laser beam is provided. Lastly, the average power of the x-rays can be very much higher than that produced by x-ray tubes, permitting the achievement of exposure rates comparable to, or exceeding, that of conventional ultraviolet light sources. All of these advantages of the Nagel et al technique make it a very desirable x-ray source for inclusion in a commercial x-ray lithography machine, if the debris problem can be managed, or preferably, eliminated.

Because x-rays are employed in a proximity printing mode in state of the art x-ray lithography machines, the size of the features which can be exposed can be limited by the size of the shadow cast about the edges of the mask features due to the finite size of the source. The shadow blurring may be determined based on the relationship:

$$\delta = S(d/L)$$

where $\delta$ is the width of the shadows cast by the source, d is the diameter of the source, L is the distance from the source to the mask and S is the seperation of the mask and wafer. For example, if S=20 microns, d=200 microns and L=70 millimeters, then the shadow blur $\delta$ at the edge of the mask will be 0.0057 microns, which is an acceptable value for printing features sizes as small as 0.5 microns or less. The small distance S between the mask and wafer, together with the short wavelength of the x-rays (for instance 14 Angstroms), also reduces the blurring due to diffraction. Thus, because of the small size of the pulsed laser induced plasma x-ray source suggested by Nagel et al the distance from the plasma x-ray source to the resist covered wafer can be reduced to about 70 millimeters in order to maximize the intensity of x-rays to reach the resist and expose the desired pattern thereon.

To directly focus such a high energy laser beam within a space of 70-100 millimeters would be require an impracticably fast (low f/number) focussing system. Instead, a preferred method of focussing is to pass the beam through a focussing lens located above the wafer plane, and to reflect the converging beam toward the x-ray generating target by a mirror located just above the wafer plane. Since the x-ray target area desirably is maintained at the reduced pressure relative to the external beam path, the focussing beam also passes through a window in the evacuated chamber housing the target. An additional geometrical constraint arises because the laser beam should be directed toward the target at an angle of 45 degrees or less, relative to the highest absorption of the laser energy by the plasma, and therefore the highest possible production of x-ray radiation. These design constraints inevitably bring at least some laser focussing on beam transport optics into close proximity to the x-ray target and this subjects the beam optics to possible deteriorating effect from debris thrown off by the plasma production process.

In accordance with one aspect of this invention, there is provided, in an x-ray lithography system in which x-rays, generated by focusing a laser beam on a target with sufficient power to create an x-ray emitting plasma, are directed towards a mask-substrate combination for causing a pattern of x-rays to expose a resist layer on the substrate, the improvement in the target comprising support means and a thin sheet of target material held by the support means. The target material sheet has a thickness sufficient to permit the ablation of the entire target material at the point the laser is focused to be substantially completed during the time the laser pulse is provided.

In such a target, the debris, created by the heat conduction from the plasma into the target subsurface, is minimized, since only the small amount of the target material required for x-ray production is ablated during the plasma heating cycle. In prior art, others have directed laser beams at thin targets for purposes unrelated to eliminating the debris. For example, in U.S. Pat. Nos. 4,290,847 to Johnson et al and 4,608,222 to Bruekner, microcapsules filled with deuterium and tritium have been struck with laser in an attempt to cause a thermonuclear reaction to occur. Others have employed thin foils, to study the acceleration of material via laser heating, as in Ripin et al, *Laser-Plasma Interaction and Ablative Acceleration of Thin Foils At* $10^{12}-10^{15}$ $W/cm^2$, Phys. Fluid Vol. 23, No. 5, Page 1012-1030 (1980). The benefits of the use of thin foils for x-ray protection have not heretofore been realized. In order to realized these benefits, many heretofore unknown features of laser plasma debris production must be taken into consideration.

One preferred embodiment of this invention is hereafter described with specific reference being made to the following figures, in which.

Figure 4:
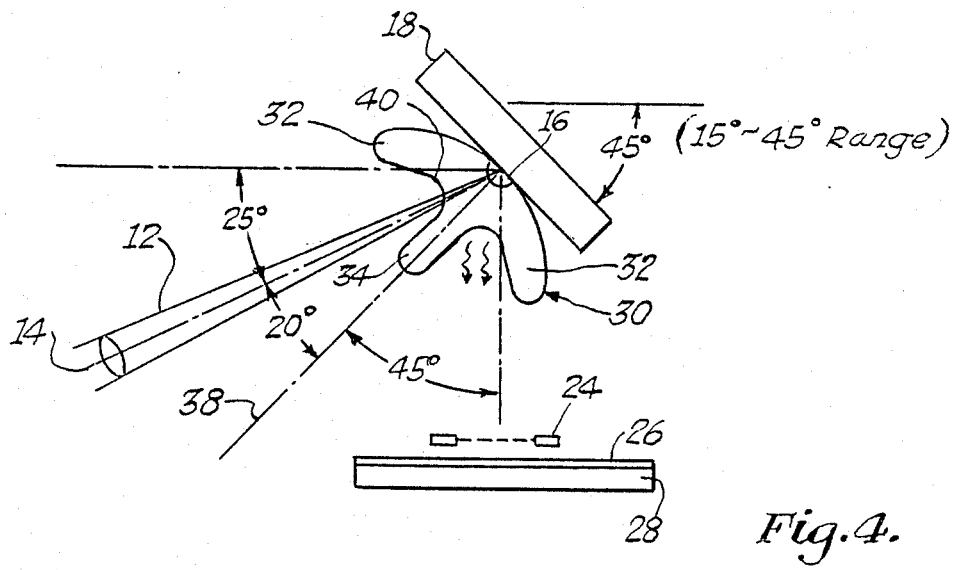
FIG. 4 shows apparatus for generating x-rays, similar to that shown in FIG. 1, with special placement of the laser beam and mask to take advantage of the minimum mass of molten droplets and evaporated material debris emitted from the generated plasma.
Figure 12:
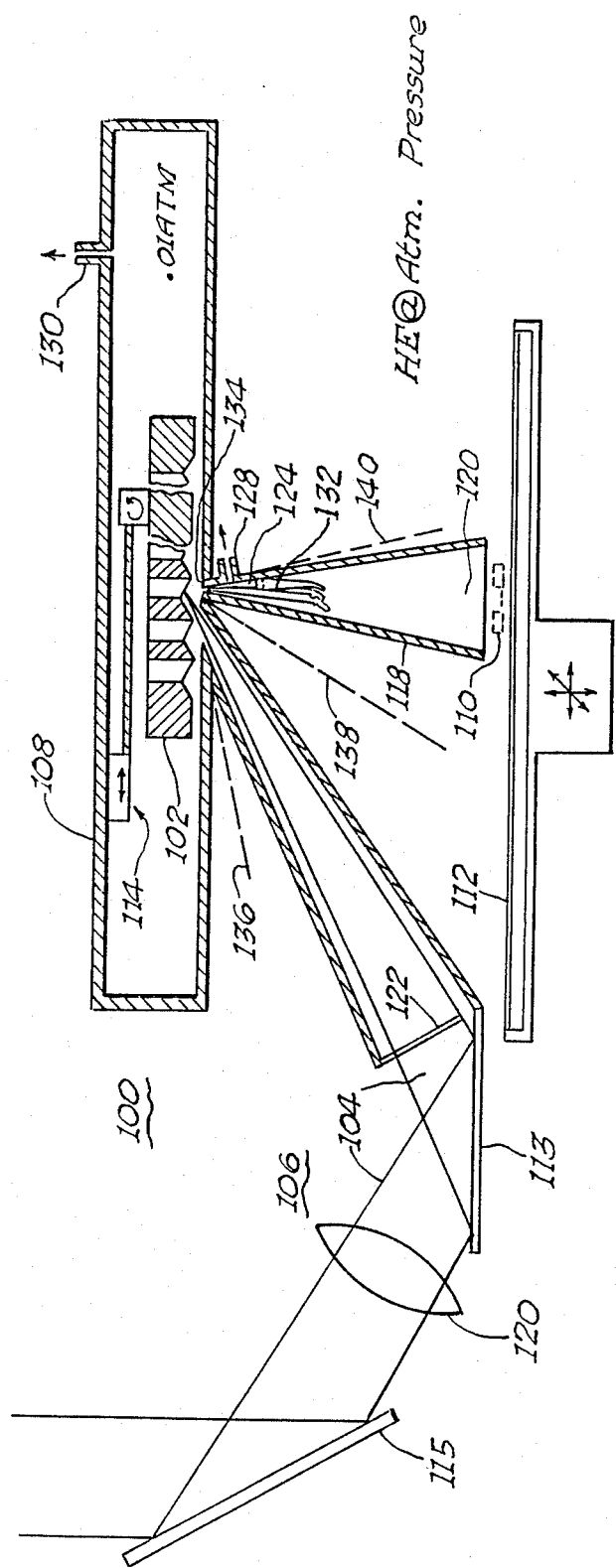

FIG. 7, consisting of FIGS. 7A and 7B, shows an enlarged view during the generation of the plasma in FIG. 7A and the effects of the heat from the plasma boring a cavity into the target mass in FIG. 7B;

FIG. 8, consisting of FIGS. 8A and 8B, shows, in FIG. 8A, a mass limited target at the instant the plasma is formed, and in FIG. 8B, such a target after the end of the plasma;

FIG. 9, consisting of FIGS. 9A and 9B, shows an improved mass limited target adapted for a commercial long life target, with a top view being shown in FIG. 9A and a cross sectional view of one target area being shown in FIG. 9B;

FIG. 10 shows a long life target, similar to the long life target shown in FIG. 4, incorporating the mass limited feature;

FIG. 11A and 11B shows, in respective cross sectional and bottom views, a more detailed view of the long life target of FIg. 10, including the leveling areas between the grooves;

FIG. 12 shows an arrangement of the components in an x-ray lithography machine utilizing the advantages permitted by the new target designs herein described; and FIG. 13 shows a block diagrams illustrating the method of fabricating the new target design shown in FIGS. 10 and 11.

Figure 1:
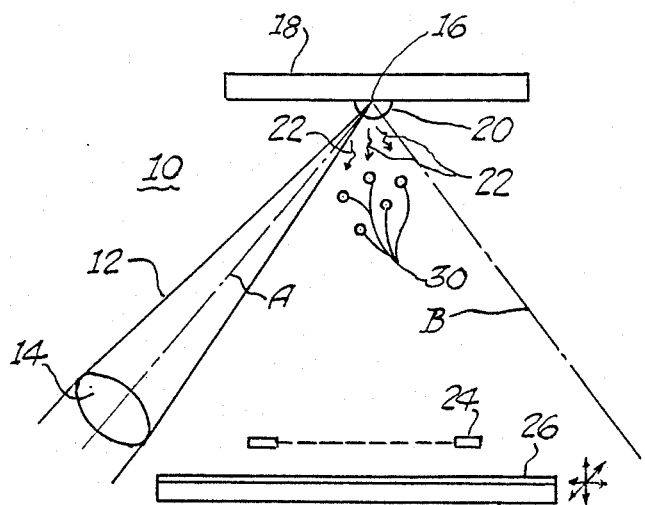
FIG. 1 shows apparatus for generating x-rays for use in an x-ray lithography according to the prior art.

Referring now to FIG. 1, the basic prior art pulsed laser beam induced plasma x-ray lithography system 10 is shown. This basic system 10 was first described by Nagel et al in aforementioned U.S. Pat. No. 4,184,078 and includes a laser beam 12 focused by a lens 14 at a focal spot 16 of a massive metal target 18. By providing beam 12 with sufficient power, a plasma 20 is created at spot 16 of a type which generates soft x-rays 22. Some of the x-rays 22 may be applied through an x-ray mask 24 towards a resist layer 26 covered silicon or gallium arsenide wafer 28 to expose a pattern on the resist layer 26 defined by the pattern in mask 24.

In addition to generating x-rays 22, system 10 also generates debris 30 as a result of high temperature, of at least one hundred and fifty thousand °C., required to create the plasma 20. The debris 30 may take the form of molten droplets of metal splattered from target 18, evaporated metal and high energy ions. Of the various types of debris 30, the high energy ions and the molten droplets can have an immediate negative effect on the lithographic process, whereas, the evaporated metal merely builds up on the mask 24 and doesn't have a serious effect until the amount of the evaporated metal is sufficient to begin absorbing the x-rays.

The high energy ions portion of the debris can cause the mask 24 to heat up, thereby causing warpage of the mask and changing the critical spacing required between the mask 24 and the resist layer 26. The molten droplets, which have a significant mass, are ejected from spot 16 in the form of a splash, that is, the force on the surface of a pool of liquid near the target surface arises from the initial reaction to the expanding plasma. If the molten droplets strike the mask 24, considerable damage can be done to the one to two micron thick membrane base of the mask 24. In fact, the molten droplets can travel entirely through the mask 24 membrane, or can become embedded in the mask 24 membrane, thereby rendering the mask 24 useless. In the past, shields have been used to prevent the evaporated metal and molten droplet debris from reaching the mask, such as described in the aforementioned Nagel et al and Grobman patents. Such shields, unfortunately absorb some of the x-rays as well as block the debris and are subject to catastrophic damage from molten droplet debris from even a single laser shot. Further, the prior art teaches using magnets to deflect the high energy ions away from the mask area, as suggested in U.S. Pat. No. 4,175,830 to Marie. This is effective in a vacuum environment, but has no effect on neutral material debris in any environment.

Figure 2:
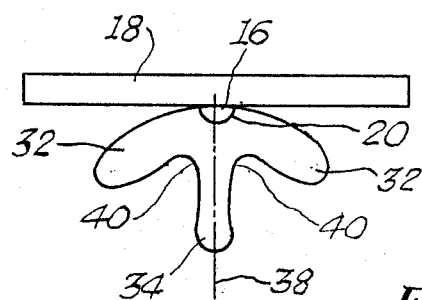
FIG. 2 shows a view of the angular displacement of the molten droplets and evaporated material portions of the debris around the focal spot of the laser beam on the target.
Figure 3:
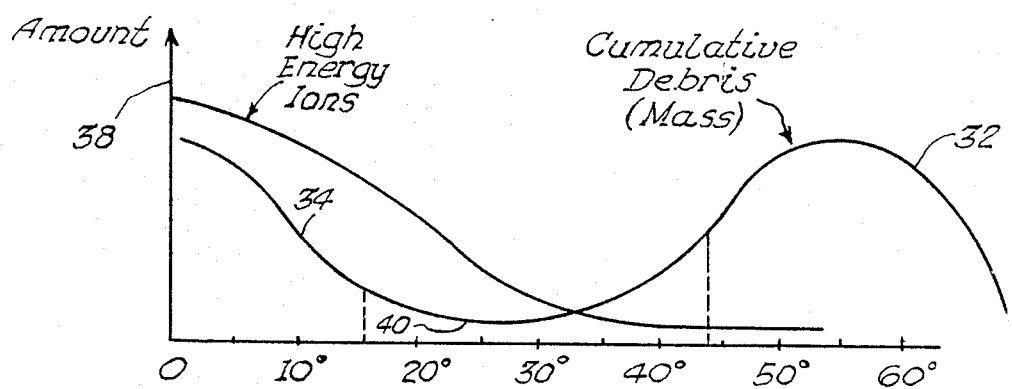
FIG. 3 shows two superimposed graphs of the mass of debris verses angular displacement and the number of high energy ions verses angular displacement, both of which are emitted from the laser pulse induced plasma.

Referring now to FIGS. 2 and 3, it has been discovered, by analyzing the debris 30 emitted from the plasma 20 at spot 16 in FIG. 1, that:

(1) the debris mass includes both molten droplets and evaporated target material;

(2) the molten droplets portion of the debris 30 constitutes the majority of the mass of the debris 30 and are concentrated in two seperate and distinct massive debris groups 32 and 34;

(3) the evaporated metal portion of the debris 30 is generally a small portion of the entire mass of the debris and is generally evenly distributed; and (4) the high energy ions portion of the debris 30 is highest along a line 38 normal to the target 18 and gradually is reduced out to a point about 45° from the normal to the target 18.

(5) some scattered laser light, most of which is directed back along the laser axis A in FIG. 1, is spectrally reflected from the target surface along axis B.

Of the two massive debris groups 32 and 34, group 34 is symmetrically concentrated about line 38 normal to the target 18 at the plasma 20 center and group 32, which is conical shaped, is concentrated around an axis approximately 45°-55° from the normal line 38, depending on laser energy and target composition. A minimum 40 amount of emitted debris mass between the two groups 32 and 34 of maximum material debris mass is believed to include only the evaporated material and not the molten droplets. In additional the incident laser radiation can be set up to minimize scattered light in this region.

This discovery with respect to the material debris 30, consisting of the molten droplets and evaporated metal, is shown in FIG. 2, as the angular displacement verses mass of the debris emitted from the plasma 20 around the spot 16. The same information is shown in FIG. 3 as a conventional X-Y graph. FIG. 3 further has superimposed thereon the angular dispersion of the number of high energy ions emitted from plasma 20. As can be seen from FIG. 3, the mass of the material debris 30 emitted from plasma 20 has a peak 34 along the normal axis 38 to the target 18 and another peak 32 at about the 55° axis from the normal. The minimum mass of material debris 30 emitted from plasma 20 occurs at point 40 between 20° and 35° away from the normal 38 and significantly reduced debris is generatede between the 15° and 45° points of the curve of FIG. 3, that is, between 15° and 45° from the normal 38 from target 18 at the point plasma 20 is created. It is believed that the debris mass around point 40 of the curve in FIGS. 2 and 3 is mostly the evaporated metal material portion of the target material debris 30, which is generally evenly distributed around spot 16. By choosing laser beam 12 to be incident on the target 18 at an angle of between 20 to 25° from normal 38, most of scattered light will fall back along axis A and B at an angle between about 15° to 30°.

Further, from FIG. 3, it can be seen that the number of high energy ions becomes low beyond 30° from the normal axis 38. Hence, if one were to align mask 24 and substrate 26 coincident with an axis at an angle between 35° to 45° from the normal axis 38, a low amount of high energy ion debris and virtually no molten droplet debris or scattered light, would strike the critical mask 24 membrane surface. The amount of high energy ions striking the mask 24 from this angle would be low and within tolerable limits, consisting that the mask is approximately 70 millimeters from the plasma 20 and, as will be explained hereafter with respect to FIG. 12, such ions will be dissipated when traveling through a one atmosphere helium environment to mask 24. As will be explained hereafter, other advantages, unrelated to the debris problem are achieved by moving the angle of positioning target 18 to the 40° to 45° range.

Referring now to FIG. 4, a diagram of a preferred alignment of the laser beam 12 and lens 14, the target 18 and the mask 24 shown in order to take advantage of the manner in which the debris has been found to be scattered. In FIG. 4, like components previously described are given the same reference numbers. As seen in FIG. 4, target 18 is positioned at a 45° angle with respect to the plane in which target 24 and substrate 28 exist. In addition, laser beam 12 is focused by lens 14 and applied from a 20° angle from the normal axis 38 to spot 16, at which spot the plasma is formed. As depicted in FIG. 4, the lens 14 is the laser optical element shown in the path of debris 30; however in practice, a window sealed in an evacuated chamber is the optical element in the path of the debris 30. Finally, mask 24 is positioned at an angle of 45° from normal axis 38 on the other side of the normal axis 38 from beam 12. Thus, both the laser beam 12, and its associated optical elements, and the mask 24 are positioned close to alignment with the minimum debris axis 40 and particularly away from the damaging molten droplets emitted around the 0° and 50° to 55° axis from spot 16. This positioning is designed to prevent damage to both the optical elememts, represented in FIG. 4 by lens 14, and the delicate mask 24 membrane.

As has been recognized in the prior art, it is necessary that target 18 have a relatively long life, such as between four to eight hours of continuous use at a rate of a laser pulse being provided every several seconds. In order for target 18 to have such a long life, it has been suggested that a disk or tape shaped member be provided and rotated a small amount after each shot. In this manner, an entire track along the disk will be used. Then the disk is moved laterally and the complete stepped rotation again occurs. In this manner, a plurality of tracks of multiple target areas can be made on each target 18. For example, see the aforementioned U.S. patent application Ser. No. 06/852,108 filed Apr. 15, 1986 and assigned to the assignee hereof.

In positioning the laser target 18 at the angle shown in FIG. 4, it is clear that the positions of the target surface intrude into the space between the target 18 and the mask 24. In a preferred embodiment of an x-ray lithographic system the space would be desirably occupied by other components or subsystem such as, for example, an optical system to align the wafer 28 to the mask 24. Thus, the target configuration shown in FIG. 4 could be unacceptable in a commercial x-ray lithography machine.

Figure 5:
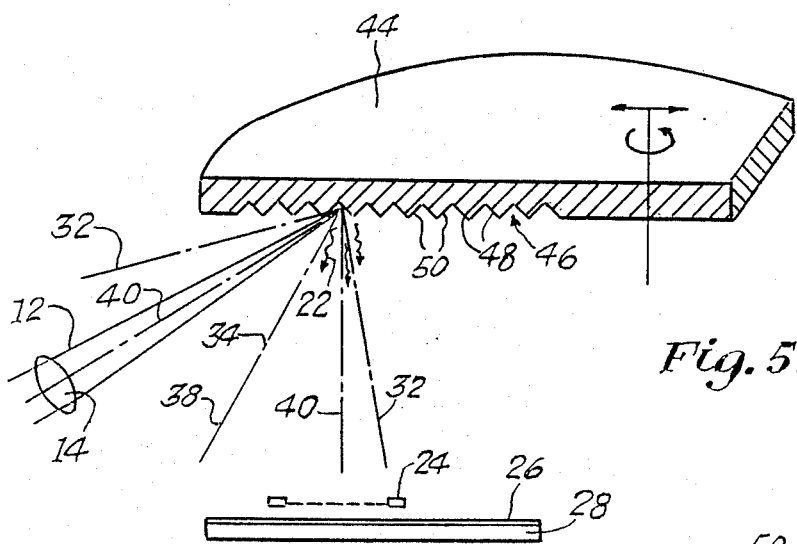
FIG. 5 shows a cross sectional view of a long life target taking advantage of the target configuration shown in FIG. 4.
Figure 6:
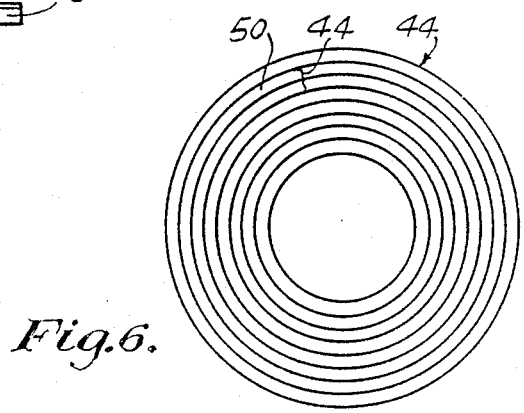
FIG. 6 shows a bottom view of the target shown in FIG. 5.

Referring now to FIGS. 5 and 6, an improved target 44 configuration taking advantage of the desirable positioning described with respect to FIG. 4, and further having a long life similar to the prior art rotating disk targets is shown. In FIG. 5, like elements previously described are given like numerical designations. It should be noted that the two groups 32 and 34 of maximum debris mass are shown as dashed lines along the axis of the group. Further, target is shown enlarged in relationship to the other elements in order to be able to more clearly show its details.

Target 44, has a general shape of a round disk of approximately three to six inches in diameter, with four inches being a nominal design. The top side of target 44 is parallel to the plane in which substrate 28 is moved during the stepping process and to the plane in which mask 24 is positioned. The top of target 44 is held by a target chuck and stepper motor moving means (not shown in FIG. 5) used to rotate and laterally move target 44 in the plane of the top thereof. On the bottom of target 44, that is, the side of target 44 upon which laser beam 12 is focused, a series of target areas are defined around a plurality of concentric circular tracks and each target area is positionable by the strepper motors to intersect focused laser beam 12.

As seen in FIG. 6, the bottom of target 44 has a series of performed concentric grooves 46 therein and each groove has a facing side 48 and a back side 50, with facing side 48 having laser beam 12 focused thereon when aligned by laterial and rotational movement to be incident with laser beam 12. As seen in FIG. 5, facing side 48 of each groove is positioned at a 30° angle with respect to the top side thereof and the moving means for target 44 is adapted to move target 44 laterally so that each of the groove 46 facing sides 48 is aligned to be incident to laser beam 12. Thus, the target area surface upon which the laser beam 12 is incident is at the same angle as that shown in FIG. 4. It should be noted that while the angle for back side 50 of groove 46 is not critical, such angle should be sufficient to allow the debris 30, whether molten droplets, evaporated material or high energy ions, to not be blocked thereby.

The selection of an angle of 45° for facing surface 48 of groove 46 is based on the desirability to minimize both the molten droplets and the high energy ions and is suggested by FIG. 3 to be appropriate to accomplished this goal. However, in some instances, the high energy ions may be impended by other factors, such as passing through a one atmosphere helium filled path in traveling to mask 24, as described hereafter with respect to FIG. 12 thereby allowing the angle to be set by other factors. Considerations which also need to be taken into account, include the number of tracks placed on target 44, which calls for a steeper angle so the width of groove 46 is narrower, or a requirement to increase the angle at which laser beam 12 is provided, which also calls for a steeper angle.

Target 44, shown in FIGS. 5 and 6, avoids much of the debris 30 problem so troublesome in the prior art. However additional studies of the source of the debris have shown that it can be almost totally eliminated. Referring now to FIG. 7, consisting of FIGS. 7A and 7B, an explanation of the source of the debris will be given. In FIG. 7, components similar to those discussed previously with respect to FIG. 1 are given identical numerical designations. In FIG. 7A, laser beam 12 is focused on focal spot 16 of target 18. Focal spot 16 is enlarged from FIG. 1 to be a 200 micron diameter circle and laser beam 12 is provided as a pulse beam for approximately 10 to 20 nanoseconds.

Shortly after laser pulse 12 is provided, a plasma 20 is formed and the top one to two microns 52 of the target 18 surface are ablated as the plasma 20 is raised to a temperature of about 150,000° C. to 500,000° C. The actual amount of the ablation 52 of target material 18 during the formation and maintenance of plasma 20 will depend upon the power and duration of the laser beam 12, and on the choice of target material. This is due to the fact that the plasma 20 is created in a direction away from the target 18, and not on or in the target 18. This x-ray emitting plasma 20 condition lasts for the duration of the laser 12 pulse and for a few nanoseconds thereafter. However, the ablation 52 of target material is substantially complete during the provision of the laser beam 12 pulse. During the time the plasma 20 exists, soft x-rays are continosly emitted therefrom. Once the laser beam ceases, the plasma 20 begins to cool and after a few nanoseconds, the x-rays emissions cease and the plasma 20 disperses. At this time, some of the energy from the plasma 20 travels vertically into the target 18 because of the conservation of momentum the region.

Referring now to FIG. 7B, as the heat conducts into the target 18 material, a cavity 54 is formed due to the melting and ionization of target 18 material. The melted target 18 material emits the motion droplets, previously discussed, and a portion of the melted target 18 is emitted as the evaporated metal previously discussed. After a period of time, in order of about one microsecond, the heat has sufficiently disbursed so that the cavity 54 is no longer increased in size and no further debris 20 is emitted.

From the above explanation, it appears that the usable result of the pulsed laser beam 12 induced plasma 20, that is the soft x-rays 22, are generated during the existence of the plasma 20 and during this time, an ablation 52 of only approximately one to two microns of target 18 material occurs. The unusable, and undesirable, result of the pulsed laser beam 12 induced plasma 20, that is the debris 30, is generated during the formation of the cavity 54 after the x-rays 22 cease to be emitted.

Referring now to FIG. 8, consisting of FIGS. 8A and 8B, a mass limited target 56 taking advantage of the observations made with respect to FIG. 7 is shown. Mass limited target 56 includes a support 58 and a thin metal membrane 60 of the between one and two microns thickness. The exact thickness of membrane 60 is selected based on the power and duration of the laser beam 12 pulse applied thereto. The thickness of membrane 60 should be sufficient to allow ablation of the entire thickness of the membrane during the time that x-rays are emitted from plasma 20. In practice, the ablation will be substantially complete during the duration of the provision of the laser 12 pulse. The outer limits of the thickness of membrane 60, based on today's laser technologies and available target density, will be between one tenth of a micron and as much as ten microns, although as previously stated, the range of between one and two microns is preferred.

As laser beam 12 strikes membrane 60, as shown in FIG. 8A, plasma 20 is created and an ablation of the target membrane 60 material occurs until the entire thickness of membrane 60 about the focal spot of laser 12 has been ablated. By properly selecting the thickness of membrane 60 and the energy and duration of laser beam 12, membrane 60 will be substantially ablated by the time the trailing edge of the laser beam 12 pulse occurs and should be totally ablated a few nanoseconds after the trailing edge of the laser beam 12 pulse, since the x-ray emitting plasma may last this long after the laser beam 12 pulse. Plasma 20 ceases emitting x-rays as it cools. The heat, which in prior art targets formed the cavity 54 shown in FIG. 7B conducts radially through membrane 60 (see FIG. 8B) outward from focal spot 16, thereby creating a rather large diameter hole 62 in membrane 60. Due to the large hole 62, target 56 has limited commercial applications due to the limited number of shots which can be made on a single target before replacement is required. Further, as the heat dissipates radially, forming hole 62, debris is still generated. This type of debris is the evaporated metal and support structure debris and not the more immediately destructive molten droplet debris.

Reffering now to FIG. 9, consisting of FIGS. 9A and 9B, a commercial version mass limited target 64 is shown. FIG. 9A shows a top view of the target 64 and FIG. 9B shows a cut-away view of one target area 66. Referring to FIG. 9A, target 64 is a disk shaped member having a plurality of concentric circles, or tracks, in adjacent target areas 66 fabricated therein and each track has many such target areas 66. Alternatively, target 64 could be designed as a cassette tape with a plurality of rows of target areas 66 fabricated along the length of the tape.

In FIG. 9B, one target area 66 is shown. Target area 66 is fabricated in the base material 68, which may be silicon, metal or plastic, all of which may be prepared by conventional techniques. The base material 68 should be selected to act as a good heat sink. A thin membrane or film 70, of for example, a polymeric material, such as a polyimide or Mylar, is affixed to the bottom of the target, that is, the side at which laser beam 12 will be focused, and a target material 72 of, for example, stainless steel, is deposited by sputtering on film 70 or otherwise affixed to the film 70. Alternatively, membrane 70 may be a thin film of a nitride material (such as silicon nitride or boron nitride), a oxynitride material (such as silicon oxynitride), a ceramic or other dielectric material or even a metal, such as titanium. The necessary properties of film 70 is that it is a good heat conductor and that the metal target material 72 is easily affixed thereto by conventional processing techniques despite the thinness of film 70.

A blast mask 71 may be added over membrane support 70 and perform several functions. First, it directs debris away from adjacent target area 66, thereby allowing closer packing of sizes. Further, it acts as another heat sink, thereby limiting the amount of neutral debris generated. Finally, it provides an extra to the possibility of partical generation at the edge of the melted hole. The blast mask 71 should be greater than 25 microns thick to provide mechanical rigidity and significant heat sink capacity.

The size of target material 72 should be selected to be at least slightly greater than the focal spot 16 diameter. For example, where the focal spot of focused laser beam 12 is 200 microns in diameter, target material 72 may be a 300 micron diameter circle. Next, a hole 74, of approximately 500 to 1500 microns diameter is fabricated through the base 68 to the film 70. Hole 74 may be formed by etching the base material by conventional techniques. Alternatively, hole 74 could have been first formed and the film layer 70 could have been applied over the hole 74. In this manner, hole 74 could be formed by laser drilling, or conventional machining, or by etching. Further, the base 68 may be a plastic or metal molded with the hole 74. The size of target material may be as big as the hole 74, or may cover the film 70 entirely.

In operation, when laser beam 12 is focused on target material 72, a plasma 20 is formed and the entire thickness of target material 72 is ablated during the existence of the plasma 20. After the plasma 20 ends, the heat is radially conducted by the remaining target material 72 and by the film 70 towards and into the base 68. Since the heat is no longer concentrated in one spot, as was the situation in the prior art, as depicted in FIG. 7, no cavity is formed in the base 68 and, hence, only an insignificant amount of evaporated debris is emitted from evaporating the remaining target material 72 and film 70. The base 68 and blast mask 71, thus, act as heat sinks for the heat from the plasma 20 and additionally confines the size of the lateral hole formed, thereby solving the problem depicted in FIG. 8B.

Referring now to FIG. 10, a commercial target 76 is shown in which the mass limited target concept, discussed above with respect to FIGS. 7-9, has been incorporated into the target 44 concept shown in FIGS. 5 and 6. Target 76 is similar to target 44, in that the bottom side, which the laser 12 is to strike, has a plurality of concentric grooves 78 and each groove has a facing side 80, to be struck by the laser 12, and an opposite side 82. Further, the angular positioning of the facing side 80 and oppposite side 82 are as previously described to allow both the mask 24 and laser beam optical elements 14 to be aligned with the minimum debris points 40 and 42. The base material 84 of target 76 may be made of any convenient material; such as a silicon wafer, plastic, or metal rather than the material required for target 44. Additionally, a film 86 is placed on the grooved bottom side to target 76 and target material 88 is affixed over film 86 in predefined adjacent positions along the facing side 80 of each groove 78. Each of the target areas 88 is selected to be of a thickness to allow substantially total ablation during the existence of the plasme. Finally, a hole 90 is placed above each of the metal target areas 88. With this structure, the mass limited target concept is incorporated with the debris limiting and the long life target concepts to provide a long life target in which emitted debris is minimized by proper positioning for use in a system in which the critical elements are protected from any debris which may still be emitted.

Referring now to FIG. 11A and 11B, a enlarged detailed view of another embodiment of target 76 is shown. More specifically, in FIG. 11A, a plan view of a portion of the grooved side of target 76 is shown and in FIG. 11B, a cross sectional view across lines 11B-11B of FIG. 11A is shown. In FIGS. 11A and 11B, hole 90 is positioned vertical to side 80 and made approximately 0.6 to 1.0 millimeters in diameter. Hole 90 may be normal to surface 80 and fabricated by a laser beam, for example. The film 86 is placed over the entire grooved surface of target 76 and a circular metal target 88 of approximately 0.20 millimeters to 0.30 millimeters in diameter is placed over the film 86 in a position approximately at the center of hole 90. Facing side 80 is approximately 0.830 millimeters in length and is positioned at an angle of approximately 25° from the plane of the bottom of target 76 and opposite side 82 is approximately 1.125 millimeters in length and is positioned at an angle of approximately 25° from the plane of target 76. Separating each groove is a flat of approximately 0.30 millimeters in length and positioned parallel to the plane of target 76.

With the above dimensions, the center to center spacing between each groove is approximately 200 millimeters. With these dimensions, laser beam 12, converging at 11° towards the center line thereof, may be provided at an angle of 20° (center line) away from the perpendicular from target 88 and at an angle of 25° from the horizontal plane of target 76. This positioning allows the emitted debris to travel in direction away from the delicate mask 24 membrane.

The flat area 92 separating each groove may be used by sensing apparatus (not shown) in the system 10 to sense the vertical position and alignment with respect to the parallel of target 76. Both of these parameters become important when using target 76 to generate x-rays by focusing a laser beam on target areas 88. If the target is sensed as being either too high or too low or not level, means (not shown) may be provided with system 10 to adjust the position of target 76 so that the metal target area 88 can be positioned at the desired focal position of the laser bean 12.

Referring now to FIG. 12 an x-ray lithography system 100 is shown incorporating the improved target design of FIG. 10. As is well known, the incident angle of the focused laser beam 104 on the target surface should be less than about 45° in order to prevent the focal spot from spreading out too greatly. With flat long life targets of the prior art, such as described in U.S. patent application Ser. No. 06/852,108, the requirement of the narrow incident angle of the laser beam and the further requirement that the distance between the target area at which the plasma is formed and the resist coated wafer should not, significantly exceed 70 millimeters, results in a very fast laser focusing lens being required and specially coated optical elements to be able to handle the high power per unit area of the converging focused beam.

In addition to target 102, the other major components of the x-ray lithography system 100 laser beam generation apparatus (not shown), described more fully in U.S. patent application Ser. No. 06/852,108, laser beam 104 directing and ficusing apparatus 106, evacuated chamber 108, within which target 102 is positioned, mask 110 and wafer stepper assembly 112, which may be any conventional stepper system used in chip fabrication lithography techniques. Within evacuated chamber 108 is target handling means 114, including a lateral motor and a rotating motor for moving target 102 so that each target area thereof is moved into incidence with focused laser beam 104. The laser focusing system includes reflecting mirrors 113 and 115 and a focusing lens 120 of conventional design for direction a focused 20 joule laser beam onto a target with a 200 micron diameter focal spot.

Evacuated chamber 108, which contains target 102 and within which the plasma is created, must be maintained at a pressure less than twenty Torr (in a helium atmosphere) in order to allow the plasma to be formed. Outside of evacuated chamber 108, a one atmosphere helium environment exists. Connected to evacuated chamber 108 is a laser beam port 116 and a differential column 118. Port 116, which is evacuated, is positioned at the angle of incidence of laser beam 104 and includes a sealed window 122 for allowing the laser beam 104 to enter port 116, while maintaining the pressure differential between the inside and outside of chamber 108. Differently column 118 may be similar to that described in U.S. Pat. No. 4,484,339 to Mallozzi et al and may include one or more intermediate chambers 124. The one atmosphere helium environment in the output portion 126 of differential column 118 inhibits the high energy ions from striking the mask 110. Further, an evacuation port 128, associated with intermediate chamber 124, and an evacuation port 130, associated with evacuated chamber 108, cause a significant air flow through the two openings 132 and 134 of differential column 118. This air flow further tends to prevent any small debris, which may still be formed by mass limited target 102 from being transmitted towards mask 110.

The facing side of each groove of target 102 is placed at a 45° angle with respect to the plane in which target 102 is moved by moving apparatus 114. This allows mask 110 to be placed directly downward from the point the plasma is formed and thus out of the path of the molten droplets which could be formed after the plasma ends. Further, laser port 116 is positioned at a 60° angle from the vertical, to also be in a minimum area of molten droplet debris. The maximum areas of molten droplet debris are shown by the dashed lines 136, 138 and 140 and correspond to the two groups 32 and 34 of FIG. 2. By being able to place laser port 116 at approximately a 60° as shown in FIG. 12 ans still keep the laser incident angle within the 45° limit to the incident face of target 102, the distance between the focusing lens 120 and target 102 is greatly increased. This allows less coating to be applied on mirror 115 and window 122 and further allows a slower, or larger f number, lens 120 to be used.

Referring now to FIG. 13, a block diagram illustrating the manner of fabricating target 76 is shown. The basic process includes two basic steps, the step 142 of providing a blank and the step 144 of processing the blank. The provided blank of step 142 may be either a plastic blank or a metal blank. If plastic, it may be made by injection molding techniques, as indicated by block 146. The molding may be either with or without the holes 90 in the blank and this may depend upon whether the holes are vertical, as shown in FIGS. 9 and 10, or perpendicular to the target material 88, as shown in FIG. 11B. If the molded blank is not made with holes 90 at block 146, then according to block 148, holes 90 are drilled, for example, by using a laser beam. If a metal blank is to be used, block 150 indicates that the blank is machined to have the proper size and location of the grooves 78. Then, according to block 150, holes are placed in the machined blank by, for example, a laser beam.

Next, the major step 144 of processing the blank requires that the film 82 and metal target areas 88 be added. First, according to block 154, a thin Mylar, or other suitable material, sheet is provided. Next, according to block 156, the prepared blank from step 142 has a ultraviolet cure responsive adhesive, or epoxy added to the grooved surface of the blank. This may be applied by spinning the blank to cause an even thickness of the adhesive. Next, according to block 158, the provided Mylar film sheet is mated to the adhesive covered blank and cured in place by L.C. ultraviolet light directed thereagainst. The Mylar sheet may be mated to the blank by either a press fitting device, a vacuum attached to the holes 90, or both techniques. It is most important that a good fit occurs in the area surrounding the holes 90 rather than the bottom of the grooves 78 and hence, the vacuum thechinque is desirable. Lastly, according to block 160, the metal target areas 88 are added by known sputtering techniques utilizing a mask, aligned with the center of the holes 90, for the sputtering.

What is claimed is:

1. In an X-ray lithography system in which X-rays, generated by focusing a laser beam on a target with sufficient power to create an X-ray emitting plasma, are directed towards a mask-substrate combination for causing a pattern of X-rays to expose a resist layer on said substrate, the improvement in said target comprising:
   support means; and
   a sheet of target material held by said support means, said target material sheet having a thicknes sufficient to permit the ablation of the entire target material sheet, said ablation being substantially completed during the time said laser pulse is provided.

2. The invention according to claim 1 wherein said target material is a layer of metal between 0.1 and 10 microns thickness.

3. The invention according to claim 1 wherein said support means has a hole therein covered by a film and said target material is placed on said film and beneath said hole.

4. The invention according to claim 3 wherein said target material and said hole are within an order of magnitude of the size of the focal spot of said laser beam.

5. The invention according to claim 4 wherein said target material is a layer of metal between 0.1 and 10 microns thickeness.

6. The invention according to claim 3 wherein said film is a polymeric material.

7. The invention according to claim 6 wherein said film is a polymide material.

8. The invention according to claim 6 wherein said film is polyethylene terephthalate.

9. The invention according to claim 3 wherein said film is a nitride material.

10. The invention according to claim 9 wherein said film is a silicon nitride material.

11. The invention according to claim 9 wherein said film is a boron nitride material.

12. The invention according to claim 9 wherein said film is a oxynitride material.

13. The invention according to claim 12 wherein said film is a silicon oxynitride material.

14. The invention according to claim 3 wherein said support is a heat sink for the heat existing after the end of the X-ray generating plasma.

15. The invention according to claim 14 wherein said film is a polymeric material.

16. The invention according to claim 15 wherein said target material and said hole are within an order of magnitude of the size of the focal spot of said laser beam.

17. The invention according to claim 16 wherein said target material is a layer of metal between 1.0 and 10 microns thickness.

18. The invention according to claim 17 wherein said film is a polyimide material.

19. The invention according to claim 18 wherein said film is polyethylene terephthalate.

20. The invention according to claim 14 wherein said film is a nitride material.

21. The invention according to claim 20 wherein said target material and said hole are within an order of magnitude of the size of the focal spot of said laser beam.

22. The invention according to claim 21 wherein said target material is a layer of metal between 1.0 and 10 microns thickness.

23. The invention according to claim 22 wherein said film is a silicon nitride material.

24. The invention according to claim 23 wherein said film is a boron nitride material.

25. The invention according to claim 24 wherein said film is a oxynitride material.

26. The invention according to claim 25 wherein said film is a silicon oxynitride material.

27. The invention according to claim 14 wherein said film is a heat conductive material for conducting heat to said heat sink.

28. The invention according to claim 27 wherein said film is selected to be of a material to permit said target material to be affixed to said film.

29. The invention according to claim 3 wherein said film is a heat conductive material.

30. The invention according to claim 29 wherein said film is selected to be of a material to permit said target material to be affixed to said film.

31. A mass limited target for use in an X-ray lithography system having a laser beam focused on a metal target material with sufficient power and duration to form an X-ray emitting plasma, said plasma causing an ablation of a given thickness of said material, said mass limited target comprising:
   a support member having an opening therethrough;
   a film affixed across said opening on the side thereof to which said focused laser beam is directed; and
   a layer of material of substantially said given thickness affixed to said film on the side thereof to which said focused laser beam is directed.

32. The invention according to claim 31 wherein said opening is of a size not more than twice the size of the focal spot of said laser beam.

33. The invention accordding to claim 31 wherein said layer of material is of a size not more than twice the size of the focal spot of said laser beam.

34. The invention according to claim 33 wherein said opening is of a size not more than twice the size of the focal spot of said laser beam.

35. The invention according to claim 34 wherein said metal material has a thickness of between 0.1 and 10 microns.

36. The invention according to claim 34 wherein said metal metal has a thickness of between 1.0 and 2.0 microns.

37. A method of exposing a pattern of X-rays on a resist coated element comprising the steps of:
   focusing a laser beam at a sheet of a mass limited target to cause the substantial ablation of the entire target material sheet, said ablation being substantially completed while an X-ray emitting plasma is formed; and aligning a mask and said element in the path of the X-rays emitted by said plasma.

38. The method according to claim 37 wherein said mass limited target has a thickness of between 0.1 and 3.0 microns.

39. The method according to claim 37 wherein said mass limited target has a thickness of between 1.0 and 2.0 microns.

40. The method according to claim 37 wherein said method further comprises the step of directing the heat from said plasma radially away from said focal spot.

41. The method according to claim 40 further including the step of dissipating said heat into a heat sink forming the base of said target.

42. The method according to claim 41 further including the step of dissipating the heat into an open area above said target material.

43. The method according to claim 40 further including the step of dissipating the heat into an open area above said target material.

44. In an X-ray lithography system in which X-rays, generated by focusing a laser beam on a target with sufficient power to create an X-ray emitting plasma, are directed towards a mask-substrate combintation for causing a pattern of X-rays to expose a resist layer on said substrate, the improvement in said target comprising: support means having an opening therein;

a film covering said opening; and a layer of target material affixed to said film beneath said opening, said layer of target material having a thickness sufficient to permit the ablation of the entire target material, said ablation to be substantially completed during the time said laser pulse is provided.

45. The invention according to claim 44 wherein said film radially conducts heat from the creation said plasma to said support means.

46. The invention according to claim 45 wherein said film is selected to be of a material to permit said target material to be affixed to said film.

47. The invention according to claim 44 wherein said film is selected to be of a material to permit said target material to be affixed to said film.

48. In a system in which X-rays, generated by focusing a laser beam on a target with sufficient power to create an X-ray emitting plasma, are directed towards a material debris sensitive object to be irradiated for causing X-rays to irradiate said object, the improvement in said target comprising:

support means having an opening therein;

a film covering said opening; and a layer of target material affixed to said film beneath said opening, said layer of target material having a thickness sufficient to permit the ablation of the entire target material, said ablation to be substantially completed during the time said laser pulse is provided.

49. The invention according to claim 48 wherein said film conducts heat, generated as a result of the creation of said plasma, to said support means, said support means acting as a heat sink for said heat conducted by said film.

50. The invention according to claim 49 wherein said film is selected to be of a material to permit said target material to be affixed to said film.

51. The invention according to claim 48 wherein said film is selected to be of a material to permit said target material to be affixed to said film.

* * * * *